(12) United States Patent
Guo et al.

(10) Patent No.: US 10,666,271 B1
(45) Date of Patent: May 26, 2020

(54) FREQUENCY SYNTHESIZER AND METHOD OF OPERATING THE SAME

(71) Applicant: Beken Corporation, Shanghai (CN)

(72) Inventors: Dawei Guo, Shanghai (CN); Ronghui Kong, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 16/508,049

(22) Filed: Jul. 10, 2019

(30) Foreign Application Priority Data

May 15, 2019 (CN) .......................... 2019 1 0402581

(51) Int. Cl.
*H03H 19/00* (2006.01)
*H03L 7/089* (2006.01)
*H03L 7/197* (2006.01)
*H03L 7/099* (2006.01)

(52) U.S. Cl.
CPC .......... *H03L 7/0891* (2013.01); *H03H 19/002* (2013.01); *H03L 7/099* (2013.01); *H03L 7/1974* (2013.01)

(58) Field of Classification Search
CPC ..... H03L 7/0891; H03L 7/099; H03L 7/1974; H03L 7/089; H03L 7/0992; H03L 7/0993; H03L 7/0994; H03H 19/002; H03H 19/00
See application file for complete search history.

(56) References Cited

U.S. PATENT DOCUMENTS 8,222,932 B2 * 7/2012 Demirkan ............... H03L 7/087
327/144
2010/0329388 A1 * 12/2010 Ko ......................... H03L 7/081
375/300

* cited by examiner

*Primary Examiner* — Jung Kim
(74) *Attorney, Agent, or Firm* — Schwegman Lundberg & Woessner, P.A.

(57) ABSTRACT

A frequency synthesizer, comprises a phase frequency detector to receive a frequency signal and a reference clock, and to output a phase difference according to a phase difference and a frequency difference between the frequency signal and the reference clock; a charge pump to generate a current according to the phase difference; a loop filter to generate a first voltage signal based on the current; a N-path filter each comprising a switch, a path filter and to generate N paths of filtered voltages based on the first voltage; a voltage control oscillator to generate a second voltage signal based on a sum of the N paths of filtered voltages; a frequency divider to generate the frequency signal based on the second voltage signal and a variable frequency dividing ratio; and a Sigma-Delta Modulator to generate the variable frequency dividing ratio based on a digital representation of a frequency fractional value and the reference clock.

17 Claims, 11 Drawing Sheets

FREQUENCY SYNTHESIZER AND METHOD OF OPERATING THE SAME

CROSS-REFERENCE TO RELATED APPLICATIONS

This application claims priority to Chinese Application Number 201910402581.4, filed 15 May 2019, entitled "FREQUENCY SYNTHESIZER INTEGRATING N-PATH FILTER AND A METHOD OF THE SAME," which is incorporated herein by reference in its entirety.

TECHNICAL FIELD

The present application generally relates to a frequency synthesizer, and particularly relates to, but not exclusively, to a frequency synthesizer integrating n-path filter.

BACKGROUND

Conventional fractional frequency synthesizers achieve a non-integer loop dividing in average by modulating the loop dividing ratio (NDIV). Most of the conventional implementations use the output of the digital Sigma-Delta Modulator (SDM), that is the NDIV, to modulate the loop dividing ratio. Such conventional implementations may introduce quantization errors in the loop dividing ratio, which can be reflected as phase noise at outputs of the fractional frequency synthesizers. The introduced quantization errors or noise may seriously affect the performance of the frequency synthesizer without special treatment.

In conventional methods of suppressing quantization noise, an additional filter is usually introduced in the loop to achieve suppression of high-frequency quantization noise to improve the performance of the frequency synthesizer. However, the additional filter may affect the phase margin of the overall loop. In many applications where a wide loop bandwidth is required, the noise near the bandwidth is amplified, thereby may degrade the quality of the phase-locked loop output signal, and may affect the performance of frequency synthesizer. In order to reduce such negative influence, the roll-off degree introduced by the additional filter is limited to a first order, which cannot meet the requirements for suppressing quantization noise. Therefore, it is difficult for a conventional fractional frequency synthesizer to add a filter with desirable performance.

SUMMARY

Embodiments of the application may provide a frequency synthesizer. The frequency synthesizer may comprise: a phase frequency detector configured to receive a frequency signal and a reference clock, and to output a phase difference according to a phase difference and a frequency difference between the frequency signal and the reference clock; a charge pump communicatively coupled to the phase frequency detector and configured to generate a current according to the phase difference; a loop filter communicatively coupled to the charge pump and configured to generate a first voltage signal based on the current; a N-path filter including N paths and communicatively coupled to the loop filter, each of the N paths of the N-path filter comprising a switch and a path filter, wherein the N-path filter is configured to generate N paths of filtered voltages based on the first voltage signal; a voltage control oscillator communicatively coupled to the N-path filter and configured to generate a second voltage signal based on a sum of the N paths of filtered voltages; a frequency divider communicatively coupled to the voltage control oscillator and the phase frequency detector, and configured to generate the frequency signal based on the second voltage signal and a variable frequency dividing ratio; and a Sigma-Delta Modulator (SDM) communicatively coupled to the frequency divider and configured to generate the variable frequency dividing ratio based on a digital representation of a frequency fractional dividing ratio and a SDM reference clock.

Embodiments of the application may provide a method of operating a frequency synthesizer. The method may comprise: receiving, by a phase frequency detector in the frequency synthesizer, a frequency signal and a reference clock; outputting, by the phase frequency detector, a phase difference according to a phase difference and a frequency difference between the frequency signal and the reference clock; generating, by a charge pump communicatively coupled to the phase frequency detector, a current according to the phase difference; generating, by a loop filter communicatively coupled to the charge pump, a first voltage signal based on the current; generating, by each of N paths of a N-path filter communicatively coupled to the loop filter, filtered voltages based on the first voltage signal, wherein each of the N paths of the N-path filter comprises a switch and a path filter; generating, by a voltage control oscillator communicatively coupled to the N-path filter, a second voltage signal based on a sum of the N paths of filtered voltages; generating, by a frequency divider communicatively coupled to the voltage control oscillator and the phase frequency detector, the frequency signal based on the second voltage signal and a variable frequency dividing ratio; and generating, by a Sigma-Delta Modulator (SDM) communicatively coupled to the frequency divider, the variable frequency dividing ratio based on a digital representation of a frequency fractional dividing ratio and a SDM reference clock.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION OF THE ILLUSTRATED EMBODIMENTS

Various aspects and examples of the application will now be described. The following description provides specific details for a thorough understanding and enabling description of these examples. Those skilled in the art will understand, however, that the application may be practiced without many of these details.

Additionally, some well-known structures or functions may not be shown or described in detail, so as to be concise and to avoid unnecessarily obscuring the relevant description.

The terminology used in the description presented below is intended to be interpreted in its broadest reasonable manner, even though it is being used in conjunction with a detailed description of certain specific examples of the application. Certain terms may even be emphasized below, however, any terminology intended to be interpreted in any restricted manner will be overtly and specifically defined as such in this Detailed Description section.

Figure 1:
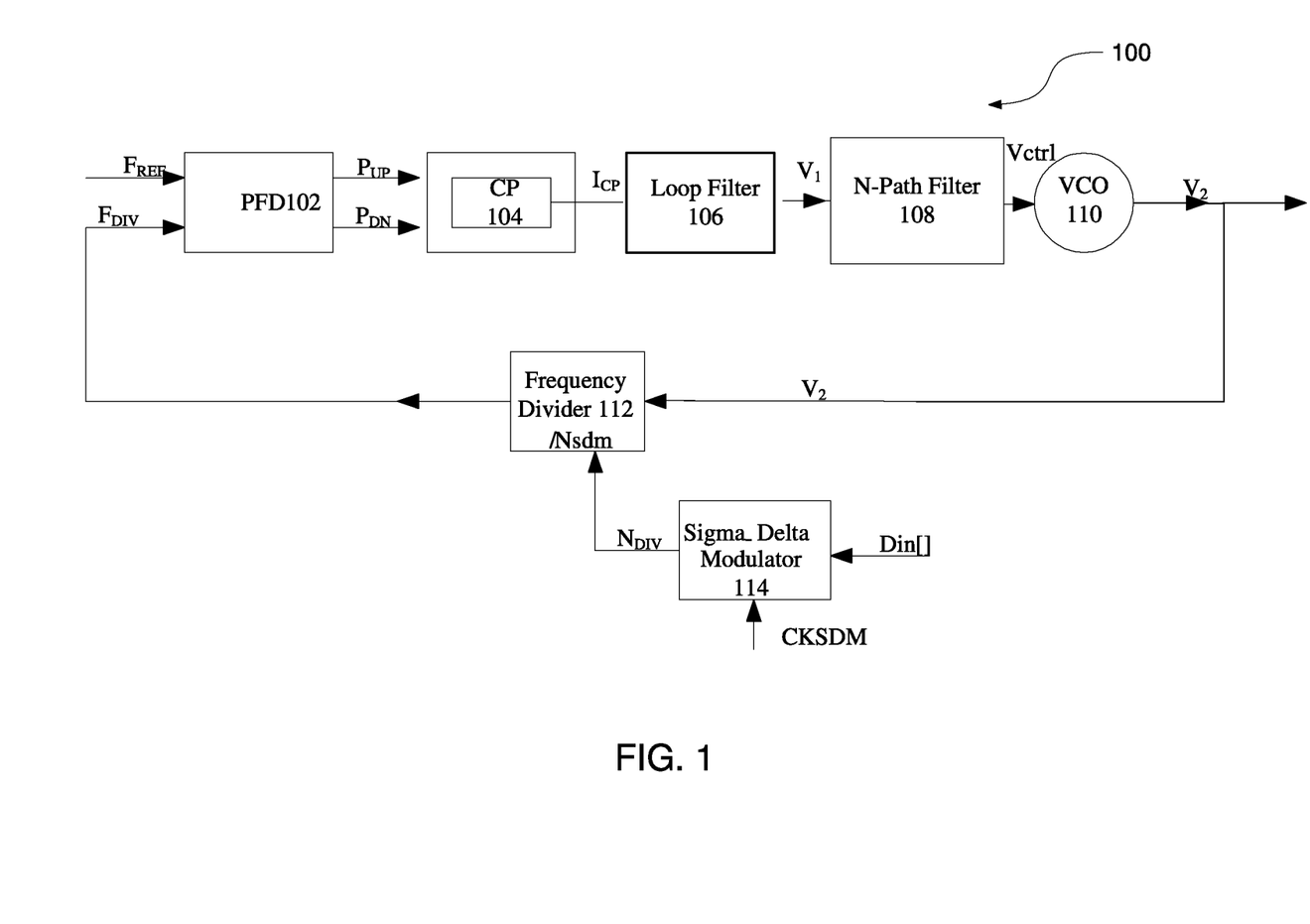
FIG. 1 is a circuit diagram illustrating a frequency synthesizer according to an embodiment of the application.

FIG. 1 is a circuit diagram illustrating a frequency synthesizer 100 according to an embodiment of the application. The frequency synthesizer 100 comprises a phase frequency detector (PFD) 102 configured to receive a frequency signal $F_{DIV}$ and a reference clock $F_{REF}$, and to output a phase difference $P_{UP}$ and $P_{DN}$ according to phase and frequency difference between the frequency signal $F_{DIV}$ and the reference clock $F_{REF}$. Note that $P_{UP}$ and $P_{DN}$ can also be referred to as a phase error signal, which is proportional to the phase difference between the frequency signal $F_{DIV}$ and the reference clock $F_{REF}$, and can represent which one among the two signals, the frequency signal $F_{DIV}$ and the reference clock $F_{REF}$, is ahead of the other. The frequency synthesizer 100 also comprises a charge pump (CP) 104 communicatively coupled to the phase frequency detector 102 and configured to generate a current $I_{CP}$ according to the phase difference $P_{UP}$ and $P_{DN}$, and a loop filter 106 communicatively coupled to the charge pump 104 and configured to generate a first voltage signal $V_1$ based on the current $I_{CP}$. The frequency synthesizer 100 further comprises a N-path filter 108 communicatively coupled to the loop filter 106, each of the N paths of the N-path filter 108 comprises a switch and a path filter. The N-path filter is configured to generate N paths of filtered voltages based on the first voltage signal $V_1$. The frequency synthesizer 100 further comprises a voltage control oscillator (VCO) 110 communicatively coupled to the N-path filter 108 and configured to generate a second voltage signal $V_2$ based on a sum of the N paths of filtered voltages. Note that $V_2$ is a voltage signal that can also be denoted as $CK_{VCO}$, which includes frequency information of interest. The frequency synthesizer 100 further comprises a frequency divider 112 communicatively coupled to the voltage control oscillator 110 and the phase frequency detector 102 and configured to generate the frequency signal $F_{DIV}$ based on the second voltage signal and a variable frequency dividing ratio $N_{DIV}$. The frequency synthesizer 100 further comprises a Sigma-Delta Modulator (SDM) 114 communicatively coupled to the frequency divider 112 and configured to generate the variable frequency dividing ratio $N_{DIV}$ based on a digital representation of a frequency fractional dividing ratio $D_{in}[\ ]$ and a SDM reference clock $CK_{SDM}$. Note that the SDM reference clock $CK_{SDM}$ has the same frequency as the reference clock $CK_{ref}$, but may have a different phase from the reference clock $CK_{ref}$. In other words, the SDM reference clock $CK_{SDM}$ may have the same source as the reference clock $CK_{ref}$. Note that both SDM reference clock and the reference clock $CK_{ref}$ are stable.

Figure 2:
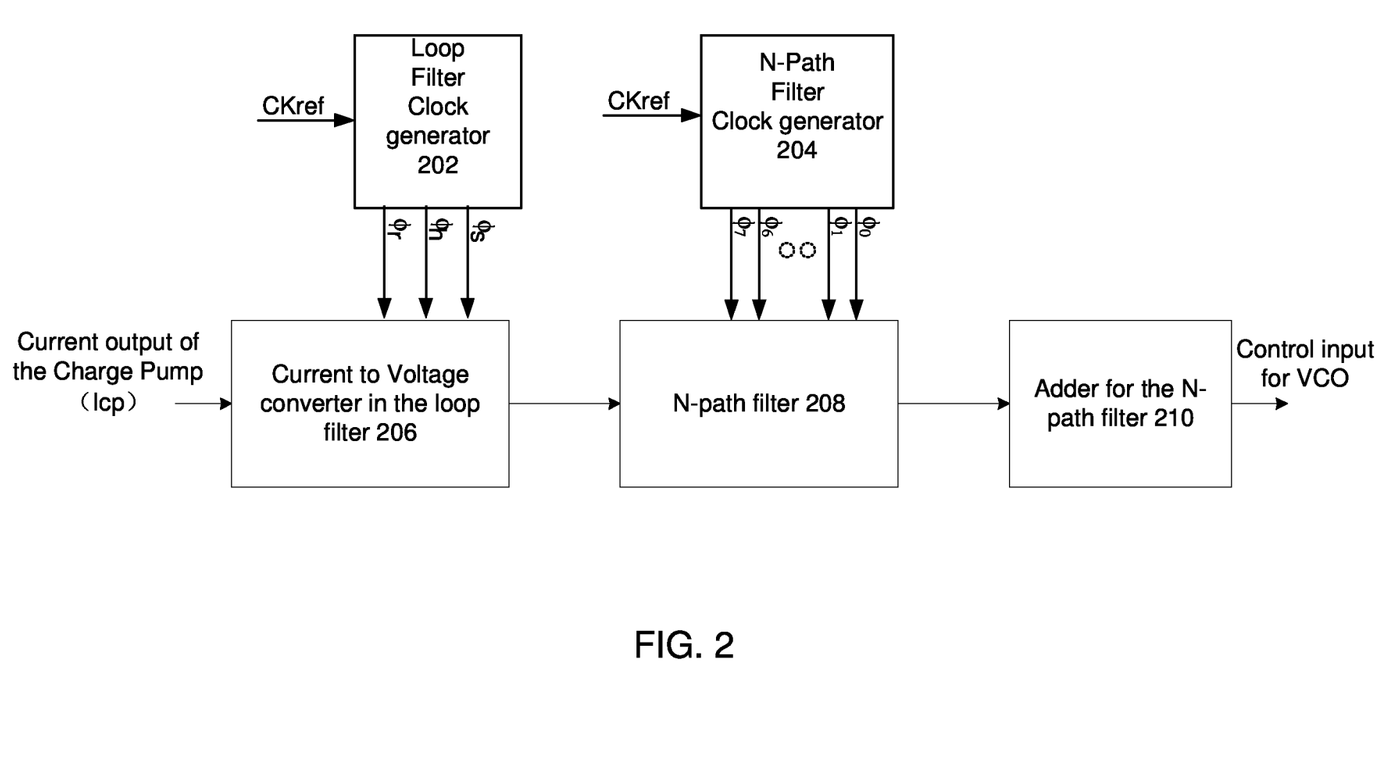
FIG. 2 is a circuit diagram illustrating a signal path for a loop path filter and a N-path filter according to another embodiment of the application.

FIG. 2 is a circuit diagram illustrating signal path for a loop path filter and a N-path filter according to another embodiment of the application. The loop filter 106 shown in FIG. 1 further comprises a loop filter clock generator 202 shown in FIG. 2. The loop filter clock generator 202 is configured to generate a sample control signal $\varphi_s$, a hold control signal $\varphi_h$, and a reset control signal $\varphi_r$ based on the phase $CK_{ref}$ of reference clock $F_{REF}$. Note that the N-path filter clock generator 204, the current to voltage converter in the loop filter 206, the N-path filter 208 and the adder for the N-path filter 210 will be discussed later.

Figure 3:
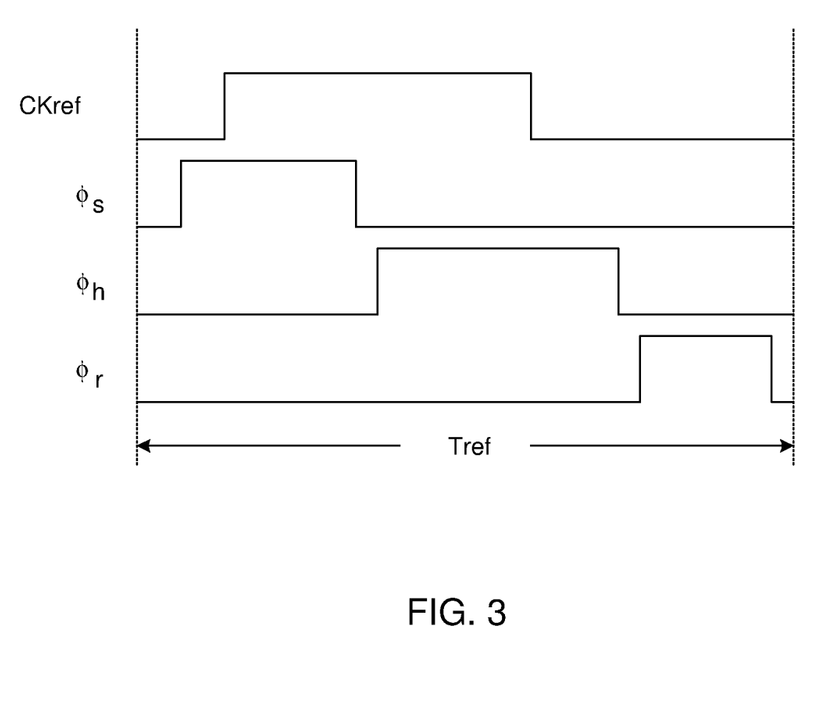
FIG. 3 is a timing diagram for the clock signals in a loop filter according to an embodiment of the application.

FIG. 3 is a timing diagram for the clock signals $\varphi_s$, $\varphi_h$ and $\varphi_r$ in a loop filter according to an embodiment of the application. The X-axis shows time and the Y-axis shows phase. As shown in FIG. 3, $CK_{ref}$ represents the timing diagram for the reference frequency $F_{REF}$. $T_{ref}$ represents a period or cycle of the reference frequency $F_{REF}$. The timing diagrams of the sample control signal $\varphi_s$, the hold control signal $\varphi_h$, and the reset control signal $\varphi_r$ are shown in FIG. 3. Note that the phases of any of the sample control signal $\varphi_s$, the hold control signal $\varphi_h$, and the reset control signal $\varphi_r$ are non-overlapping, so as to control capacitors within the loop filter, and convert the current $I_{CP}$ from the charge pump 104 to the first voltage signal $V_1$.

Referring back to FIG. 2, the N-path filter 108 shown in FIG. 1 further comprises a N-path filter clock generator 204 shown in FIG. 2. The N-path filter clock generator 204 is configured to generate a first multi-phase control signal $\varphi_1$, a second multi-phase control signal $\varphi_2$, a third multi-phase control signal $\varphi_3$ . . . and a N-th multi-phase control signal $\varphi_N$, based on the phase $CK_{ref}$ of reference clock $F_{REF}$. Note that the current to voltage converter in the loop filter 206, the N-path filter 208 and the adder for the N-path filter 210 will be discussed later.

Figure 4:
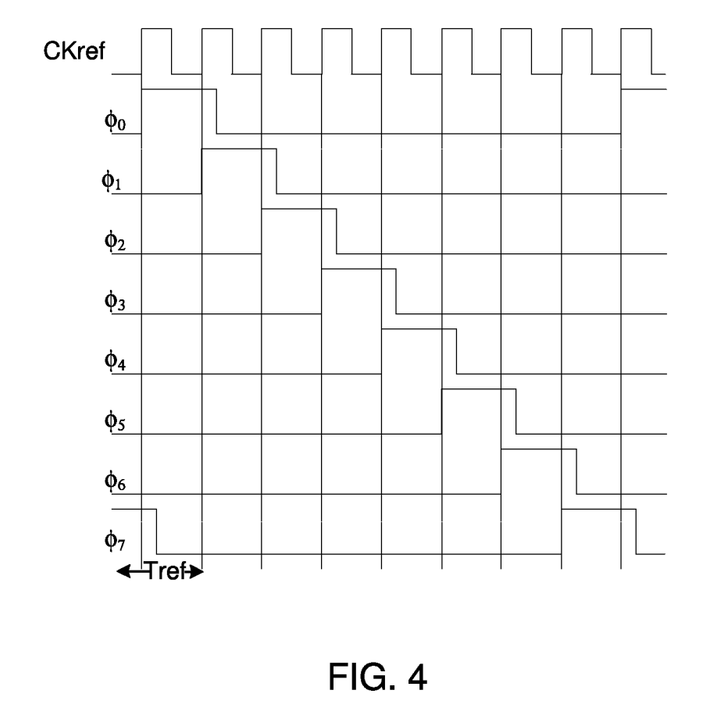
FIG. 4 is a timing diagram for the clock signals in each path in a N-path filter according to an embodiment of the application.

FIG. 4 is a timing diagram for the clock signals in a N-path filter according to an embodiment of the application. The X-axis shows time and the Y-axis shows phase. As shown in FIG. 4, $CK_{ref}$ represents the timing diagram for the reference frequency $F_{REF}$. The timing diagrams of the first multi-phase control signal $\varphi_1$, the second multi-phase control signal $\varphi_2$, the third multi-phase control signal $\varphi_3$ . . . the N-th multi-phase control signal $\varphi_N$ are shown in FIG. 4. In an embodiment shown in FIG. 4, N=7. The resulting multi-phase clocks have a consistent phase relationship between adjacent signals. In other words, the adjacent control signals in N-path filter have a predetermined phase relationship. For example, adjacent multi-phase control signals start from adjacent rising edges of the reference clock $CK_{ref}$. In other words, each multi-phase control signals $\varphi_j$ is set high after a clock cycle $T_{ref}$ from its adjacent signal $\varphi_{j-1}$ is set high. Note that $0 \leq j \leq N$. Note that in FIG. 4 a high (1) duration of a control signals $\varphi_j$ can overlap with a high (1) duration of its adjacent control signal $\varphi_{j-1}$. However, alternatively, the adjacent control signals $\varphi_j$ and $\varphi_{j-1}$ may not have overlapping high durations. Note that throughout the description, multi-phase control signal, multi-path control signal, and N-path control signal are used interchangeable to all refer to the signals $\varphi_1, \varphi_2, \ldots, \varphi_N$.

Now referring back to FIG. 2, the loop filter control clock generator 202 generates control signals $\varphi_s$, $\varphi_h$, and $\varphi_r$ for the loop filter. The current to voltage converter 206 in the loop filter converts the charge output of the charge pump into a first voltage signal $V_1$. The N-path filter clock generator 204 generates a corresponding control signal $\varphi_j$ for each path of the multi-path filter based on the reference clock $CK_{ref}$. The multi-path filter 208 comprises multiple paths in parallel, and each path performs a relatively independent filtering function. The adder 210 adds the outputs of the respective filtering paths of the N-path filter 208. The filtering of the loop control voltage is achieved by adding correlated N paths. As the control signal is first sampled in each path and then filtered by a respective path filter, the entire filtering is completed in the mixed signal domain. As filtering is performed by a multi-path filter comprising N paths having the same transmission character, the folding of the quantization noise due to sampling by a single-branch filtering can be avoided.

Figure 5A:
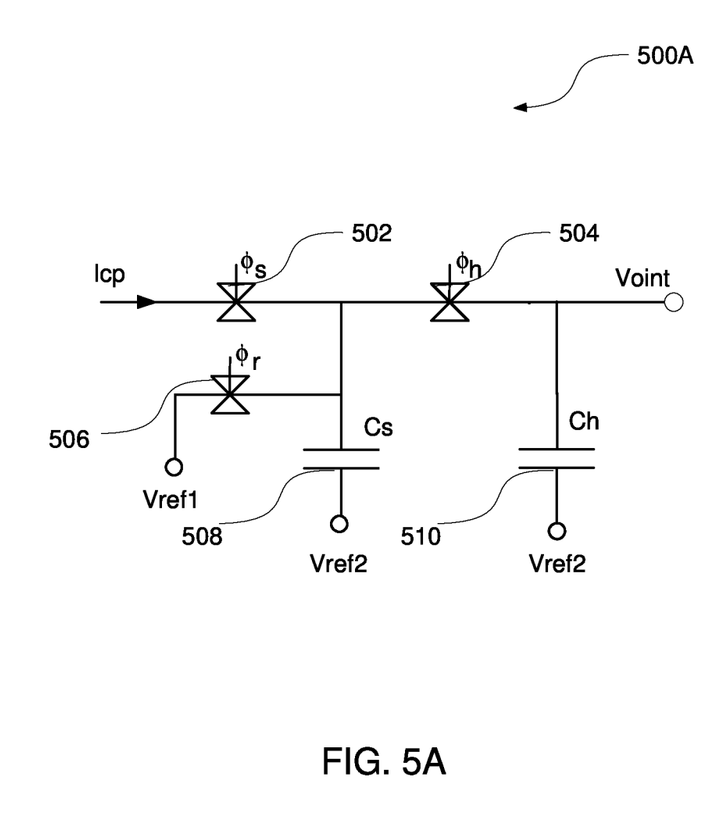
FIG. 5A is a circuit diagram illustrating a loop filter according to an embodiment of the application.
Figure 5B:
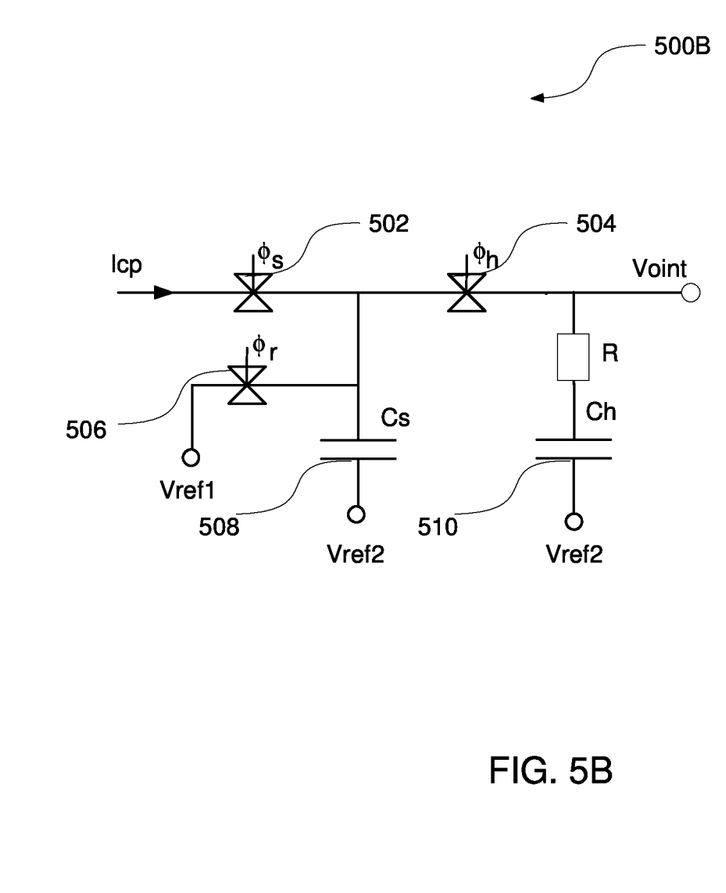
FIG. 5B is a circuit diagram illustrating a loop filter according to another embodiment of the application.

FIG. 5A is a circuit diagram illustrating a loop filter 500A according to an embodiment of the application. The loop filter 500A converts the output current $I_{CP}$ of the charge pump to voltage signal $V_{oint}$. The loop filter 500A comprises a sample switch 502, a hold switch 504, a reset switch 506, a sample capacitor Cs 508, and a hold capacitor Ch 510. The sample switch 502 is communicatively coupled to the charge pump and configured to receive the current $I_{CP}$. The hold switch 504 is communicatively coupled to the sample switch 502 and the reset switch 506 and configured to output an internal output voltage signal $V_{oint}$. The reset switch 506 is configured to receive a first reference voltage $V_{ref1}$. The sample capacitor Cs 508 includes a first plate communicatively coupled to a voltage reference point having a second reference voltage $V_{ref2}$ and a second plate communicatively coupled to the sample switch 502, the reset switch 502 and the hold switch 504. The hold capacitor Ch 510 includes a first plate communicatively coupled to the hold switch 504 and configured to smoothen the current $I_{CP}$ and a second plate communicatively coupled to the second voltage reference point. In an embodiment, the second reference voltage $V_{ref2}$ may be ground (GND). Alternatively, the first reference voltage $V_{ref1}$ and the second reference voltage $V_{ref2}$ may be different. Note that the sample switch 502 is controlled by the sample control signal $\varphi_s$, the hold switch 504 is controlled by the hold control signal $\varphi_h$, and the reset switch 506 is controlled by the reset control signal $\varphi_r$. Alternatively, a resistor R may be connected in serial with the hold capacitor Ch 510, which is shown in FIG. 5B.

Figure 6:
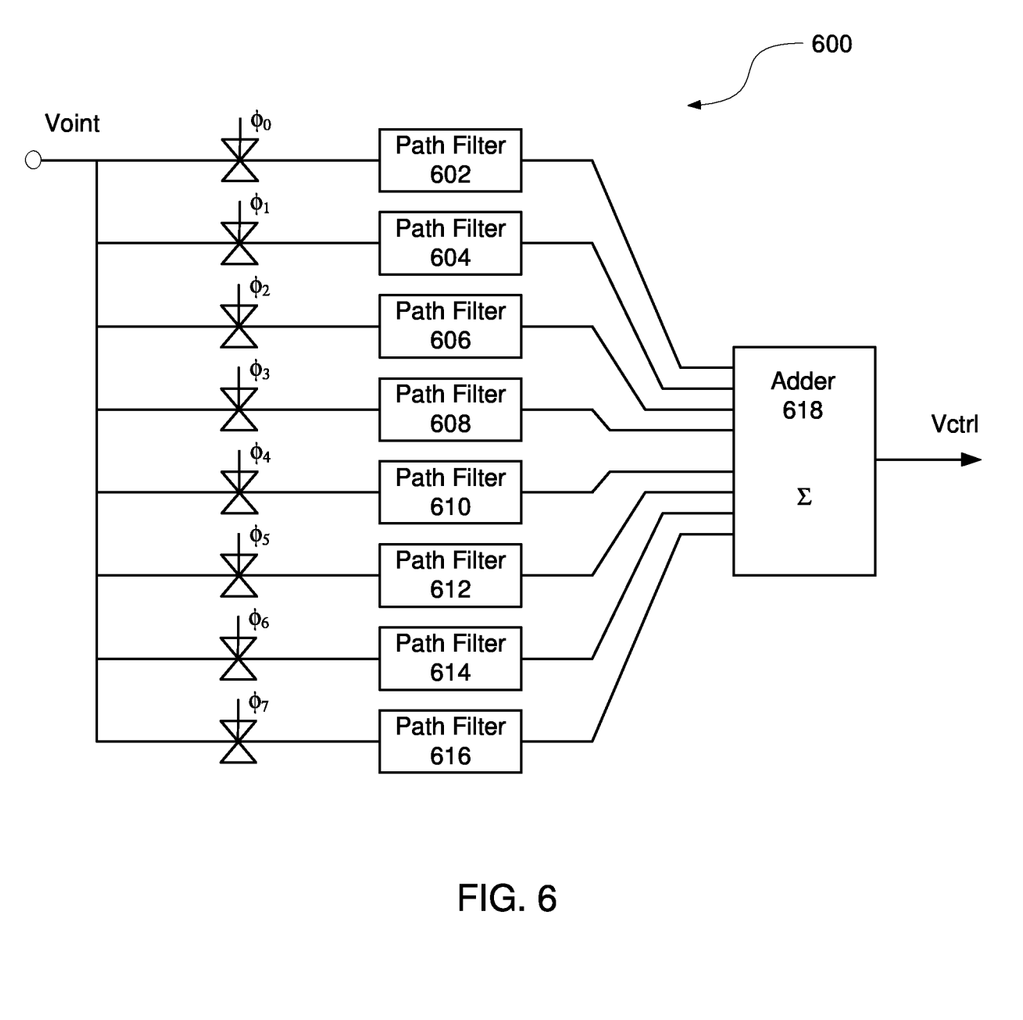
FIG. 6 is a circuit diagram illustrating an N-path filter according to an embodiment of the application.

FIG. 6 is a circuit diagram illustrating the N-path filter according to an embodiment of the application.

The first voltage signal of the loop filter unit, $V_{oint}$ (or $V_1$ as shown in FIG. 1), is controlled by a multi-phase control signal $\varphi_1$-$\varphi_7$, and is filtered by each path filter 602, 604, 606, 608 ... and 616. An adder 618 sums the plurality of filtered outputs in the voltage domain to generate a control signal, $V_{ctrl}$. For example, the adder 618 is communicatively coupled between the N-path filter and the voltage control oscillator, and configured to generate the sum of the N paths of filtered voltages by adding the N paths of filtered voltages. The summation can alternatively be done in a voltage-controlled oscillator by controlling different voltage control units, as will be discussed in detail with respect to the following FIG. 8.

Figures 7A, 7B:
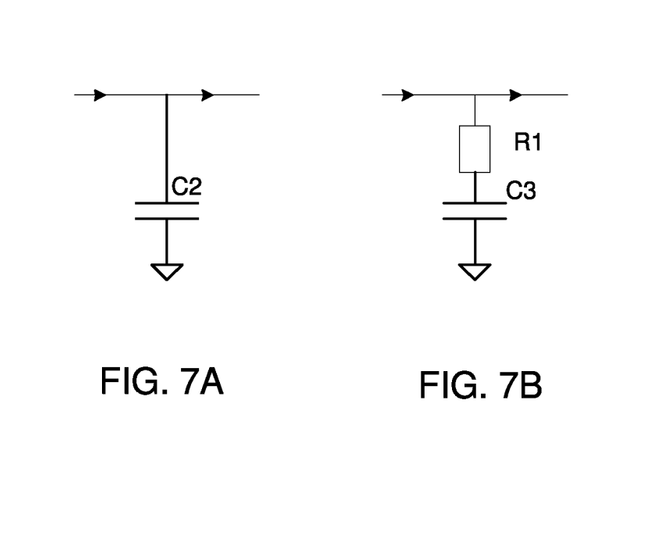
FIGS. 7A, 7B and 7C are circuit diagrams illustrating implementations of a single path filter within the N-path filter according to an embodiment of the application.
Figure 7C:
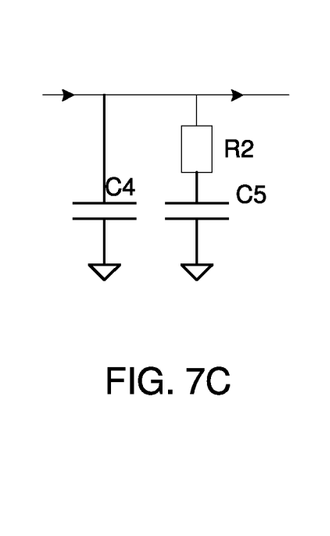

FIGS. 7A, 7B and 7C are circuit diagrams illustrating implementations of a single path within the N-path filter according to an embodiment of the application.

As shown in FIG. 7A, each path of the N-path filter comprises a second capacitor $C_2$. Alternatively, as shown in FIG. 7B, each path of the N-path filter comprises a first resistor R1 and a third capacitor $C_3$ connected in serial. Alternatively, as shown in FIG. 7C, each path of the N-path filter comprises a fourth capacitor $C_4$, a second resistor $R_2$ and a fifth capacitor $C_5$ connected in serial to the second resistor $R_2$, wherein the fourth capacitor $C_4$ is connected in parallel to a serial combination of the second resistor R2 and the fifth capacitor $C_5$.

During operation, in the overall loop as shown in FIG. 1, loop frequency divider 112 divides the output $V_2$ of the voltage-controlled oscillator 110 and the output $F_{DIV}$ of the frequency divider 112, in turn drives the phase frequency detector 102, and charge pump 104 converts the phase information $P_{UP}$ and $P_{DN}$ into the current signal $I_{CP}$. The N-path filter 108 then filters the output voltage of the loop filter 106 to generate the control voltage Vail for the voltage-controlled oscillator 110, and the control voltage $V_{ctrl}$ modulates the VCO frequency, realizes the overall closed-loop control, realizes the phase locked loop (PLL) function, and generates the output signal $V_2$ with low phase noise.

In the loop filter and the multi-drop filter according to an embodiment of the present application, the current to voltage converter of the loop filter converts the charge output $I_{CP}$ of the charge pump into a voltage signal $V_1$, and the voltage signal $V_1$ is filtered by the N-path filter, and the final output $V_{ctrl}$ controls the voltage-controlled oscillator.

The charge pump 104 in the loop converts the phase difference into the current $I_{CP}$. To ensure that the loop has sufficient phase margin, the embodiment of the present application employs a loop of the first type (with only one integral unit, such as a voltage-controlled oscillator), as shown in FIG. 1. The loop filter 106 first converts the charge pump output signal $I_{CP}$ into a voltage signal $V_{oint}$ through the sample and hold process. A network including resistors and capacitors, or only including capacitors, suppresses noise with frequency higher than a preterminal frequency. The clock signal $\varphi_s$, $\varphi_h$, $\varphi_r$ are sample, hold, and reset control signals, respectively.

The N-path filter comprises multiple branches in parallel, and each path completes a relatively independent filtering function. Each path is controlled by a N-path clock generator that generates control clocks, and adjacent paths of the N-path have a consistent phase relationship. For example, the difference of phase between adjacent paths is constant. The adder (for example, the adder 618 as shown in FIG. 6) adds the outputs of the respective filter paths, and achieve filtering of the loop control voltage by adding the correlated respective path. Since the control signal is first sampled in each path and then passed through the filter, the entire filtering is completed in the mixed signal domain, that is, mixed continuous time domain and discrete time domain. Since the filtering is performed by a N-path filter comprising a plurality of paths having the same transmission characteristics, folding of the quantization noise caused by sampling by a conventional single-path filtering can be avoided by the N-path filter.

Along the signal flow, the multi-path addition can be performed prior to the voltage-controlled oscillator, if the output of each filter path is added in the voltage domain, then the VCO can be controlled singly using the summed control signal. Alternatively, VCO can perform voltage control first, and then the adder performs summation of a plurality of paths. The output of each filter paths controls a single voltage-controlled path of the VCO with multiple control paths, and frequency-controlled signals are then added in the VCO, which will be discussed further with respect to FIG. 8.

Figure 8:
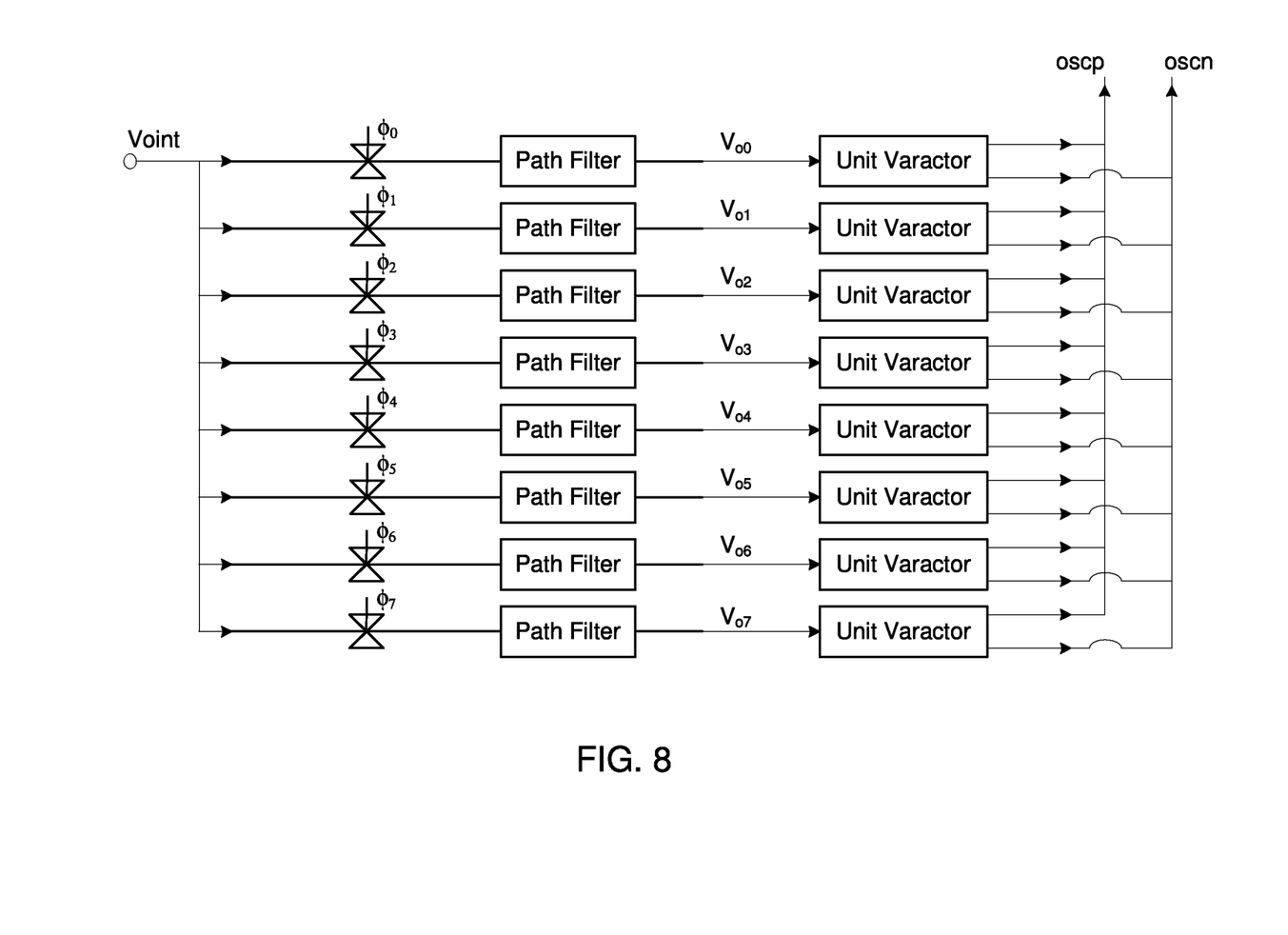
FIG. 8 is a circuit diagram illustrating an N-path filter according to another embodiment of the application.

A multi-path (the number of paths is N) generates N paths of filtered voltages $V_{o0}$, $V_{o1}$, $V_{o2}$, $V_{o3}$, $V_{o4}$, $V_{o5}$, $V_{o6}$, and $V_{o7}$ by filtering the voltage signal $V_{oint}$. The voltage-controlled oscillator sums the resulting N-path filtered voltages, as shown in FIG. 8. Now, take N=8 as an example. Each of the multiple paths (such as the $i^{th}$ path) is controlled by a separate control signal (such as φi) and each path filter is connected to the input signal $V_{oint}$ through a corresponding switch that is controlled by a respective control signal φi. The phases of the control signals $φ_0$~$φ_7$ are evenly distributed between 0~2π, and the phase difference of any adjacent signals is φ(i+1)−φ(i)=2π/8, and φ7−φ0=2π/8. After the single path of the path filter filters the single path signal, it generates a corresponding voltage signal $V_{oi}$ (i=1, 2, 3, 4, 5, 6, or 7). The voltage signal $V_{oi}$ acts on the identical variable capacitors (unit Varactor) in the voltage-controlled oscillator to control the frequency of the voltage-controlled oscillator. Due to the uniformity of the voltage-controlled variable capacitors, the frequency change can be expressed as $f=(V_{o0}+V_{o1}+V_{o2}+V_{o3}+V_{o4}+V_{o5}+V_{o6}+V_{o7})*K_{vco}$, where $K_{vco}$ is the gain of each voltage-controlled path of the voltage-controlled oscillator. The gain of the i-path is defined as $K_{vco}=\Delta f/\Delta V_{oi}$, and for all other paths except Voi, $\Delta Voj=0$.

Here, it is defined $V_o=V_{o0}+V_{o1}+V_{o2}+V_{o3}+V_{o4}+V_{o5}+V_{o6}+V_{o7}$ and $V_o/V_{oint}=N_{FLT}$, $\Delta f=(N_{FLT}*V_{oint})*K_{vco}$. It can be seen that the output voltage of the loop filter is again filtered by a filter with a response function or characteristics $N_{FLT}$, and then applied to the voltage of the voltage-controlled oscillator. The response function $N_{FLT}$ can suppress quantization noise.

Figure 9:
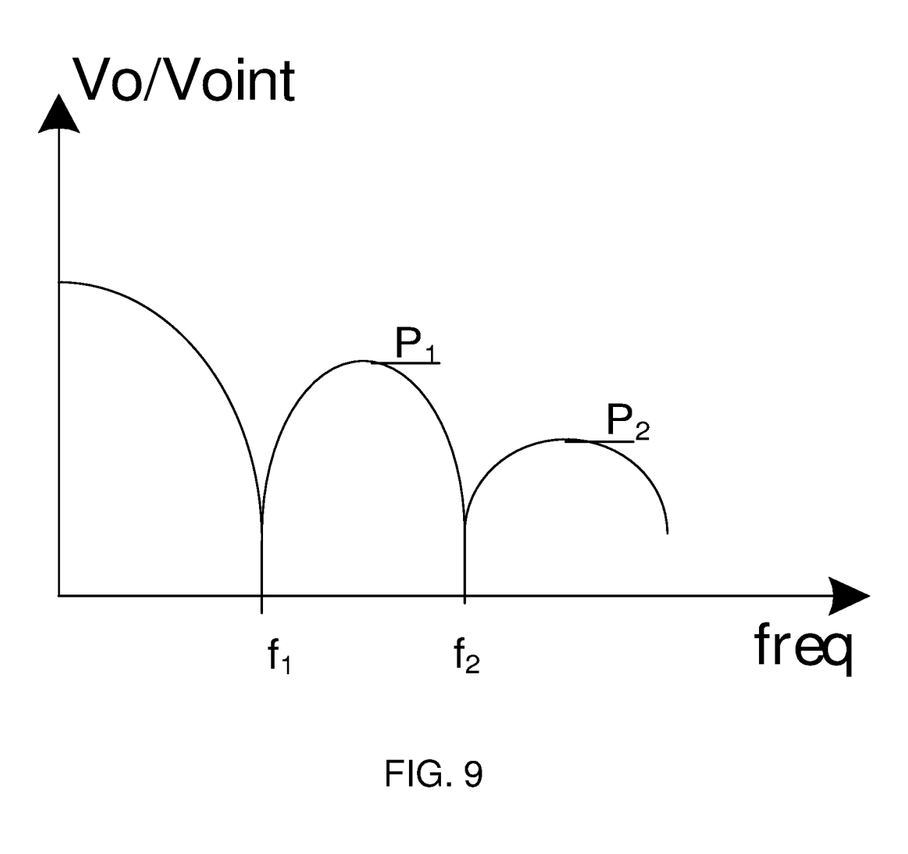
FIG. 9 is a diagram illustrating a frequency response of the N-path filter according to another embodiment of the application.

Due to the specific phase relationship between the multi-phase control signals, the response characteristics $N_{FLT}$ of the overall N-path filter $N_{FLT}=V_o/V_{oint}$ are consistent with that of a single path filter as shown in FIG. 8. Furthermore, the spectrum aliasing in a single path generated by each of the control signals $φ_{0-7}$ will be cancelled after the summation. Under the requirement of a large loop bandwidth, the phase margin of the loop may be adversely affected after the introduction of the multi-path filter. To reduce this effect, the structure of each of the path filter can be designed as any of FIG. 7A, 7B or 7C. The filtered response curve has the characteristic curve as shown in FIG. 9. By selecting the total number of paths (N) of the N-path filter, the notch frequency in the response curve can be adjusted, such as $f_1$ and $f_2$ as shown in FIG. 9. By selecting the structure and parameters of the path filter, the path filter can adjust the notch depth and peak value of the protruding portion outside direct current (DC), such as P1, P2.

Alternatively, a corresponding switch of each of the N-path filter is controlled by a corresponding phase control signal $φ_0$~$φ_7$, that is to say N=7, wherein a phase difference between the corresponding phase control signal and a neighboring phase control signal of the corresponding phase control signal equals 2π/N.

Figure 10:
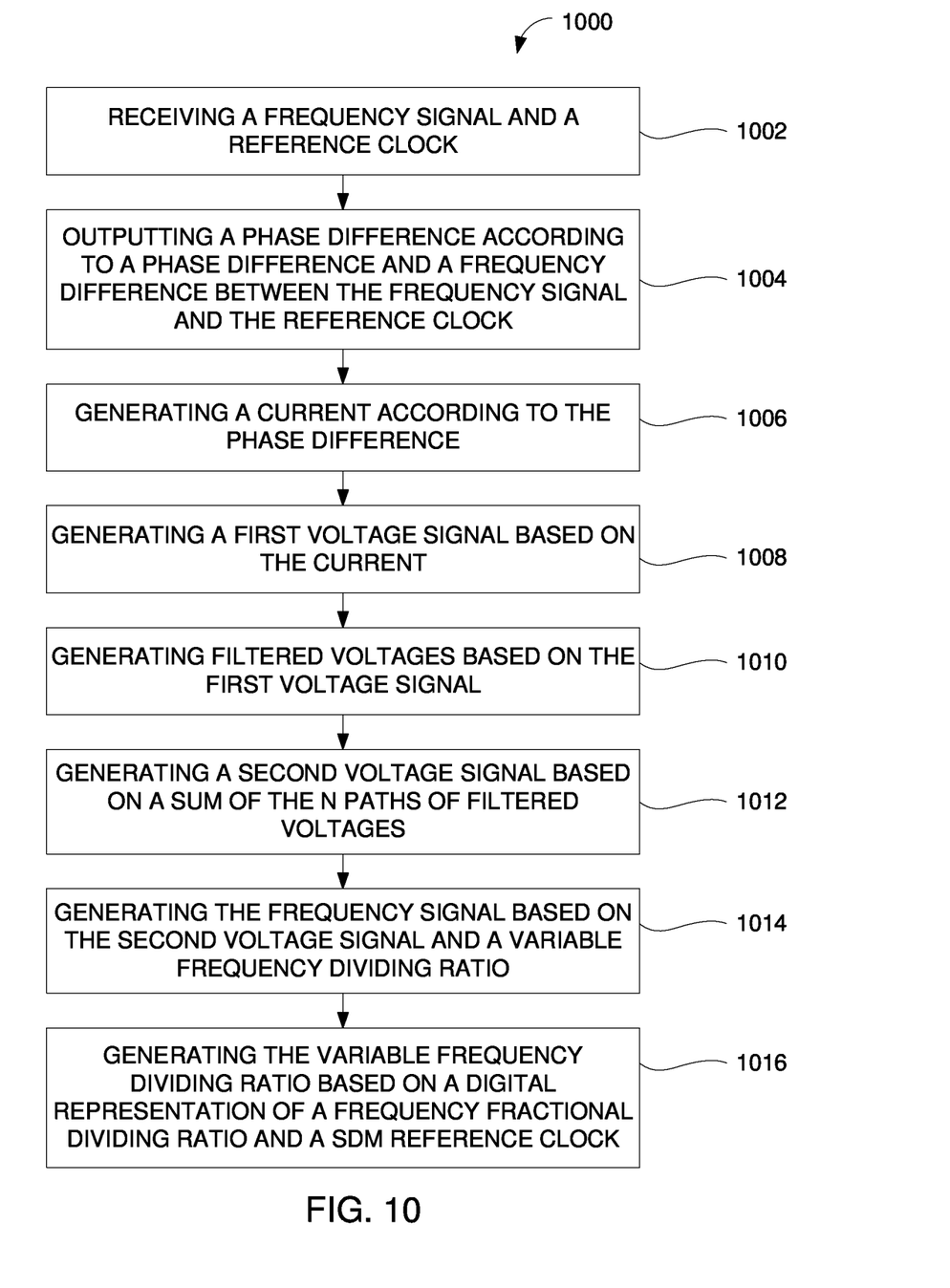
FIG. 10 is a flow chart illustrating a method of operating a frequency synthesizer according to an embodiment of the application.

FIG. 10 is a flow chart illustrating a method 1000 of operating a frequency synthesizer according to an embodiment of the application.

The method 1000 of operating a frequency synthesizer comprises receiving in block 1002, by a phase frequency detector (PFD) in the frequency synthesizer, a frequency signal and a reference clock; generating in block 1004, by the phase frequency detector, a phase difference according to phase and frequency difference between the frequency signal and the reference clock; generating in block 1006, by a charge pump communicatively coupled to the phase frequency detector, a current according to the phase difference; generating in block 1008, by a loop filter communicatively coupled to the charge pump, a first voltage signal based on the current; generating in block 1010, by each of N paths of a N-path filter communicatively coupled to the loop filter, filtered voltages based on the first voltage signal, wherein each of the N-path filter comprises a switch, a path filter; generating in block 1012, by a voltage control oscillator communicatively coupled to the N-path filter, a second voltage signal based on a sum of the N paths of filtered voltages; generating in block 1014, by a frequency divider communicatively coupled to the voltage control oscillator and the phase frequency detector, the frequency signal based on the second voltage signal and a variable frequency dividing ratio; and generating in block 1016, by a Sigma-Delta Modulator (SDM) communicatively coupled to the frequency divider, the variable frequency dividing ratio based on a digital representation of a frequency fractional dividing ratio and a SDM reference clock.

Alternatively, the method 1000 further comprises (not shown in FIG. 10) generating, by an adder communicatively coupled between the N-path filter and the voltage control oscillator, the sum of the N paths of filtered voltages by adding the N paths of filtered voltages.

Alternatively, generating in block 1012 by a voltage control oscillator communicatively coupled to the N-path filter, a second voltage signal based on a sum of the N paths of filtered voltages is further implemented by generating, by each of N voltage control oscillating elements, an oscillated voltage signal based on a corresponding one of the N paths of filtered voltages; and generating, by an adder communicatively coupled to the N voltage control oscillating elements, the second voltage signal by adding the N oscillated voltage signals.

Alternatively, generating in block 1008, by a loop filter communicatively coupled to the charge pump, a first voltage signal based on the current is further implemented by receiving, by a sample switch communicatively coupled to the charge pump, the current; outputting, by a hold switch communicatively coupled to the sample switch and a reset switch, an internal output voltage signal; and receiving, by the reset switch, a reference voltage; wherein a first plate of a first capacitor is communicatively coupled to ground and a second plate of the first capacitor is communicatively coupled to the sample switch, the reset switch and the hold switch.

Alternatively, the loop filter further comprises a Resistor-Capacitor filter communicatively coupled to the hold switch and configured to filter glitches in the current.

Alternatively, each of the N-path filter comprises a second capacitor.

Alternatively, each of the N-path filter comprises a first resistor and a third capacitor connected in serial to the first resistor.

Alternatively, each of the N-path filter comprises a fourth capacitor, a second resistor and a fifth capacitor connected in serial to the second resistor, wherein the fourth capacitor is connected in parallel to a serial combination of the second resistor and the fifth capacitor.

Alternatively, a corresponding switch of each of the N-path filter is controlled by a corresponding phase control signal, wherein a phase difference between the corresponding phase control signal and a neighboring phase control signal of the corresponding phase control signal equals 2π/N.

At least one embodiment introduces a N-Path Filter into the loop filter. By properly designing the characteristics of the N-Path filter, the N-Path filter can realize the effective suppression of the quantization noise, and improve the overall performance of the frequency synthesizer.

For example, an embodiment of the application does not suppress quantization noise in a wide frequency band from the PLL bandwidth to the reference clock frequency, but instead the embodiment suppresses the quantization noise in the local frequency band. For example, the embodiment introduces a multi-path filter in an analog phase-locked loop (PLL) filter loop, filters the quantization noise by using the digital processing method in the mixed domain Due to the application of multi-path filtering, the embodiment avoids the folding of the quantization noise during filtering, thereby improving the performance of the frequency synthesizer.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present application. Moreover, features of one embodiment may be incorporated into other embodiments, even where those features are not described together in a single embodiment within the present document. Accordingly, the application is described by the appended claims

What is claimed is:

1. A frequency synthesizer, comprising:
    a phase frequency detector configured to receive a frequency signal and a reference clock, and to output a phase difference according to a phase difference and a frequency difference between the frequency signal and the reference clock;
    a charge pump communicatively coupled to the phase frequency detector and configured to generate a current according to the phase difference;
    a loop filter communicatively coupled to the charge pump and configured to generate a first voltage signal based on the current;
    a N-path filter including N paths and communicatively coupled to the loop filter, each of the N paths of the N-path filter comprising a switch and a path filter, wherein the N-path filter is configured to generate N paths of filtered voltages based on the first voltage signal, wherein N is a natural number greater than 1;
    a voltage control oscillator communicatively coupled to the N-path filter and configured to generate a second voltage signal based on a sum of the N paths of filtered voltages;
    a frequency divider communicatively coupled to the voltage control oscillator and the phase frequency detector, and configured to generate the frequency signal based on the second voltage signal and a variable frequency dividing ratio; and
    a Sigma-Delta Modulator (SDM) communicatively coupled to the frequency divider and configured to generate the variable frequency dividing ratio based on a digital representation of a frequency fractional dividing ratio and a SDM reference clock.

2. The frequency synthesizer of claim 1, further comprising an adder communicatively coupled between the N-path filter and the voltage control oscillator and configured to generate the sum of the N paths of filtered voltages by adding the N paths of filtered voltages.

3. The frequency synthesizer of claim 1, wherein the voltage control oscillator further comprises:
    N voltage control oscillating elements, each of the N voltage control oscillating elements configured to generate an oscillated voltage signal based on a corresponding one of the N paths of filtered voltages; and
    an adder communicatively coupled to the N voltage control oscillating elements and configured to generate the second voltage signal by adding the N oscillated voltage signal.

4. The frequency synthesizer of claim 1, wherein the loop filter further comprises:
    a sample switch communicatively coupled to the charge pump and configured to receive the current;
    a hold switch communicatively coupled to the sample switch and a reset switch, and configured to output an internal output voltage signal, wherein the reset switch is configured to receive a first reference voltage;
    a sample capacitor with a first plate communicatively coupled to a voltage reference point having a second reference voltage and a second plate communicatively coupled to the sample switch, the reset switch and the hold switch; and
    a hold capacitor including a first plate communicatively coupled to the hold switch and configured to smoothen the current and a second plate communicatively coupled to the second voltage reference point.

5. The frequency synthesizer of claim 1, wherein each path of the N-path filter comprises a second capacitor.

6. The frequency synthesizer of claim 1, wherein each path of the N-path filter comprises a first resistor and a third capacitor connected in serial to the first resistor.

7. The frequency synthesizer of claim 1, wherein each path of the N-path filter comprises a fourth capacitor, a second resistor, and a fifth capacitor connected in serial to the second resistor, wherein the fourth capacitor is connected in parallel to a serial combination of the second resistor and the fifth capacitor.

8. The frequency synthesizer of claim 1, wherein a corresponding switch of each path of the N-path filter is controlled by a phase control signal of a corresponding path, wherein a phase difference between the corresponding phase control signal and a neighboring phase control signal of the corresponding phase control signal equals $2\pi/N$.

9. A method of operating a frequency synthesizer, comprising:
    receiving, by a phase frequency detector in the frequency synthesizer, a frequency signal and a reference clock;
    outputting, by the phase frequency detector, a phase difference according to a phase difference and a frequency difference between the frequency signal and the reference clock;
    generating, by a charge pump communicatively coupled to the phase frequency detector, a current according to the phase difference;
    generating, by a loop filter communicatively coupled to the charge pump, a first voltage signal based on the current;
    generating, by each of N paths of a N-path filter communicatively coupled to the loop filter, filtered voltages based on the first voltage signal, wherein each of the N paths of the N-path filter comprises a switch and a path filter, wherein N is a natural number greater than 1;
    generating, by a voltage control oscillator communicatively coupled to the N-path filter, a second voltage signal based on a sum of the N paths of filtered voltages;

generating, by a frequency divider communicatively coupled to the voltage control oscillator and the phase frequency detector, the frequency signal based on the second voltage signal and a variable frequency dividing ratio; and generating, by a Sigma-Delta Modulator (SDM) communicatively coupled to the frequency divider, the variable frequency dividing ratio based on a digital representation of a frequency fractional dividing ratio and a SDM reference clock.

10. The method of claim 9, further comprising generating, by an adder communicatively coupled between the N-path filter and the voltage control oscillator, the sum of the N paths of filtered voltages by adding the N paths of filtered voltages.

11. The method of claim 9, wherein generating, by a voltage control oscillator communicatively coupled to the N-path filter, a second voltage signal based on a sum of the N paths of filtered voltages is further implemented by generating, by each of N voltage control oscillating elements, an oscillated voltage signal based on a corresponding one of the N paths of filtered voltages; and generating, by an adder communicatively coupled to the N voltage control oscillating elements, the second voltage signal by adding the N oscillated voltage signals.

12. The method of claim 9, wherein generating, by a loop filter communicatively coupled to the charge pump, a first voltage signal based on the current is further implemented by:

receiving, by a sample switch communicatively coupled to the charge pump, the current;

outputting, by a hold switch communicatively coupled to the sample switch and a reset switch, an internal output voltage signal; and receiving, by the reset switch, a reference voltage; wherein a first plate of a first capacitor is communicatively coupled to ground and a second plate of the first capacitor is communicatively coupled to the sample switch, the reset switch and the hold switch.

13. The method of claim 12, wherein the loop filter further comprises a Resistor-Capacitor filter communicatively coupled to the hold switch and configured to filter glitches in the current.

14. The method of claim 9, wherein each of the N-path filter comprises a second capacitor.

15. The method of claim 9, wherein each of the N-path filter comprises a first resistor and a third capacitor connected in serial to the first resistor.

16. The method of claim 9, wherein each of the N-path filter comprises a fourth capacitor, a second resistor and a fifth capacitor connected in serial to the second resistor, wherein the fourth capacitor is connected in parallel to a serial combination of the second resistor and the fifth capacitor.

17. The method of claim 9, wherein a corresponding switch of each of the N-path filter is controlled by a corresponding phase control signal, wherein a phase difference between the corresponding phase control signal and a neighboring phase control signal of the corresponding phase control signal equals $2\pi/N$.

* * * * *